United States Patent
Yoshimura et al.

(10) Patent No.: US 10,148,920 B2
(45) Date of Patent: Dec. 4, 2018

(54) OPTICAL MODULE AND SCANNING-TYPE IMAGE DISPLAY DEVICE

(71) Applicant: HITACHI-LG DATA STORAGE, INC., Tokyo (JP)

(72) Inventors: Yasuhiro Yoshimura, Tokyo (JP); Ayano Otsubo, Tokyo (JP); Seiichi Katou, Tokyo (JP); Hiroshi Ogasawara, Tokyo (JP); Tatsuya Yamasaki, Tokyo (JP); Kenji Watabe, Ibaraki (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 15/542,006

(22) PCT Filed: Feb. 10, 2016

(86) PCT No.: PCT/JP2016/053883
§ 371 (c)(1),
(2) Date: Jul. 6, 2017

(87) PCT Pub. No.: WO2016/136446
PCT Pub. Date: Sep. 1, 2016

(65) Prior Publication Data
US 2017/0359556 A1    Dec. 14, 2017

(30) Foreign Application Priority Data

Feb. 25, 2015 (JP) .................................. 2015-034700

(51) Int. Cl.
*G03B 21/20* (2006.01)
*H04N 9/31* (2006.01)
(Continued)

(52) U.S. Cl.
CPC ......... *H04N 9/3144* (2013.01); *G03B 21/008* (2013.01); *G03B 21/145* (2013.01);
(Continued)

(58) Field of Classification Search
CPC .. H04N 9/3144; H04N 9/3155; H04N 9/3161; H04N 9/3164; H04N 9/312;
(Continued)

(56) References Cited

U.S. PATENT DOCUMENTS

2004/0017469 A1    1/2004 Itabashi
2005/0007562 A1    1/2005 Seki et al.
(Continued)

FOREIGN PATENT DOCUMENTS

JP    61-022394 U    2/1986
JP    2001-154134 A    6/2001
(Continued)

OTHER PUBLICATIONS

International Search Report, PCT/JP2016/053883, dated Apr. 26, 2016, 2 pgs.

*Primary Examiner* — William C Dowling
(74) *Attorney, Agent, or Firm* — Volpe and Koenig, P.C.

(57) ABSTRACT

In an optical module and a scanning-type image display device, a reduction in heat insulating effect due to a natural convection generated between the optical module and a case is suppressed to alleviate laser overheating and thermal expansion or contraction of each component and obtain a stable projection image quality. In an optical module that couples laser beams from a plurality of laser beam sources 1a, 1b, 1c and irradiates the laser beams to a desired position, a cover that covers the optical module is provided, a second cover is provided in a space between the optical module and the cover, and a projecting part is provided on a surface of the second cover facing the optical module.

9 Claims, 14 Drawing Sheets

(51) Int. Cl.
*H01S 5/022* (2006.01)
*H01S 5/024* (2006.01)
*G03B 21/00* (2006.01)
*G03B 21/14* (2006.01)
*G03B 21/16* (2006.01)

(52) U.S. Cl.
CPC .............. *G03B 21/16* (2013.01); *H01S 5/022* (2013.01); *H01S 5/024* (2013.01); *H04N 9/312* (2013.01); *H04N 9/3129* (2013.01); *H04N 9/3135* (2013.01); *H04N 9/3141* (2013.01); *H04N 9/3155* (2013.01); *H04N 9/3161* (2013.01); *H04N 9/3164* (2013.01); *G03B 21/2033* (2013.01)

(58) Field of Classification Search
CPC .. H04N 9/3135; G03B 21/145; G03B 21/008; G03B 21/2033; H01S 5/024; H01S 5/022
See application file for complete search history.

(56) References Cited

U.S. PATENT DOCUMENTS

| | | | |
|---|---|---|---|
| 2012/0057136 A1 | 3/2012 | Enomoto et al. | |
| 2012/0140784 A1 | 7/2012 | Quirk et al. | |
| 2013/0242265 A1 | 9/2013 | Kato et al. | |
| 2014/0160447 A1 | 6/2014 | Kobayashi et al. | |
| 2016/0342076 A1* | 11/2016 | Katou | H04N 9/3129 |
| 2017/0180688 A1* | 6/2017 | Otsubo | G02B 26/0833 |
| 2018/0007325 A1* | 1/2018 | Katou | G02B 26/10 |

FOREIGN PATENT DOCUMENTS

| | | |
|---|---|---|
| JP | 2003-142767 A | 5/2003 |
| JP | 2004-341210 A | 12/2004 |
| JP | 2011-170271 A | 9/2011 |
| JP | 2012-070007 A | 4/2012 |
| JP | 2012-078564 A | 4/2012 |
| JP | 2013-190594 A | 9/2013 |
| JP | 2014-115445 A | 6/2014 |

* cited by examiner

A-A SECTIONAL VIEW

A-A SECTIONAL VIEW

B-B SECTIONAL VIEW

B-B SECTIONAL VIEW

A-A SECTIONAL VIEW

B-B SECTIONAL VIEW

A-A SECTIONAL VIEW

A-A SECTIONAL VIEW

A-A SECTIONAL VIEW

OPTICAL MODULE AND SCANNING-TYPE IMAGE DISPLAY DEVICE

TECHNICAL FIELD

The present invention relates to an optical module and a scanning-type image display device. For example, the present invention relates to an optical module that emits laser beams from a plurality of lasers so as to align the laser beams along a single optical axis, and a scanning-type image display device that displays an image by using the laser beams from the optical module.

BACKGROUND ART

In recent years, compact projectors that can be easily carried about and can display images on large screens have been actively developed. Compact projectors that can be connected to notebook PCs and the like and video cameras and the like having built-in projectors that can project recorded images are already available in the market. Thus, it is predicted that projectors built in cellular phones or smart phones will also become available in future.

As a projector, a scanning-type image display device that couples and scans beams from a plurality of laser beam sources is known. It is also predicted that such a projector will be mounted on a vehicle or the like utilizing the high luminance of an image, and be applied to a head-up display so that an image is projected onto a windshield or a navigation image is displayed, for example. In such a scanning-type image display device, the projection image quality may deteriorate due to expansion or contraction of components caused by a temperature change. In addition, there is a need to set the temperature of each component to a heatproof temperature or lower.

As a heat-insulating structure for an optical module, for example, a structure disclosed in PTL 1 is known. In PTL 1, peripheral parts of the optical module housed in a package are covered with a heat-insulating material. Further, PTL 2 discloses that a cover is provided so as to prevent transfer of heat generated from a polygon mirror.

CITATION LIST

Patent Literature

PTL 1: Japanese Unexamined Patent Application Publication No. 2003-142767
PTL 2: Japanese Unexamined Patent Application Publication No. 2001-154134

SUMMARY OF INVENTION

Technical Problem

However, in the structure disclosed in PTL 1, a large air space is generated between the package and an element to be cooled, so that a heat transfer occurs due to a convection and the heat insulating effect deteriorates.

Also in the structure disclosed in PTL 2, a space is generated between a mechanical deflector and the cover, and thus there is a concern that a heat transfer occurs due to a convection and the heat insulating effect deteriorates.

The present invention has been made in view of the above-mentioned problems, and an object of the present invention is to provide an optical module and a scanning-type image display device which can suppress a reduction in heat insulating effect due to a natural convection, reduce thermal expansion or contraction of each component, and obtain a stable projection image quality.

Solution to Problem

In order to solve the above issue, the present invention is an optical module that couples laser beams from a plurality of laser beam sources and irradiates the laser beams to a desired position, and the optical module includes: a cover that covers the optical module; a second cover provided between the optical module and the cover; and at least one projecting part provided in a space between a first laser beam source and a second laser beam source on a surface of the second cover facing the optical module.

Also, in order to solve the above issue, the present invention is an optical module that couples laser beams from a plurality of laser beam sources and irradiates the laser beams to a desired position, and the optical module includes: a cover that covers the optical module; a second cover provided between the optical module and the cover; and a projecting part provided on a surface of a corner part of the second cover facing the optical module.

Furthermore, according to the present invention, in the optical module, the projecting part is formed on the surface facing the optical module in an area other than an area in which light is emitted from the optical module.

Furthermore, according to the present invention, in the optical module, the projecting part has an L-shape.

Furthermore, according to the present invention, in the optical module, the projecting part is structured to have two upper and lower stages.

Furthermore, according to the present invention, in the optical module, the cover includes two components of an upper cover and a lower cover, and a lower part of the upper cover and an upper part of the lower cover are each provided with a notch and the notches are fit together.

Furthermore, according to the present invention, in the optical module, the cover includes three components of an upper cover, an intermediate cover, and a lower cover, and a lower part of the upper cover, an upper part and a lower part of the intermediate cover, and an upper part of the lower cover are each provided with a notch, and the notches are fit together.

Furthermore, the present invention is a scanning-type image display device including: an optical module that couples laser beams from a plurality of laser beam sources and causes a scanning mirror to irradiate the coupled laser beams to a desired position; a video signal processing circuit that extracts a horizontal synchronizing signal and a vertical synchronizing signal from an image signal externally input; a laser beam source drive circuit that supplies each of the laser beam sources with a drive current; and a scanning mirror drive circuit that controls the scanning mirror based on the horizontal synchronizing signal and the vertical synchronizing signal, wherein the cover is mounted on the scanning-type image display device.

In order to solve the above issue, the present invention includes: an optical module that couples laser beams from a plurality of laser beam sources and causes a scanning mirror to irradiate the coupled laser beams to a desired position; a video signal processing circuit that extracts a horizontal synchronizing signal and a vertical synchronizing signal from an image signal externally input; a laser beam source drive circuit that supplies each of the laser beam sources with a drive current; and a scanning mirror drive circuit that controls the scanning mirror based on the horizontal synchronizing signal and the vertical synchronizing signal. In the optical module that couples laser beams from the plurality of laser beam sources and irradiates the laser beams to a desired position, a cover that covers the optical module is provided, a second cover is provided between the optical module and the cover, and at least one projecting part is provided on a surface of the second cover facing the optical module.

Advantageous Effects of Invention

According to the present invention, it is possible to provide an optical module and a scanning-type image display device having a structure in which, in a space between a cover and an optical module, a projecting part for controlling an air flow is formed between a plurality of beam sources, thereby suppressing a natural convection generated in the space between the cover and the optical module, especially, between the lasers, reducing a temperature rise of the lasers and thermal expansion or contraction of each component, and obtaining a stable projection image quality.

DESCRIPTION OF EMBODIMENTS

Embodiments of the present invention will be described below with reference to the drawings.

First Embodiment

Figure 1:
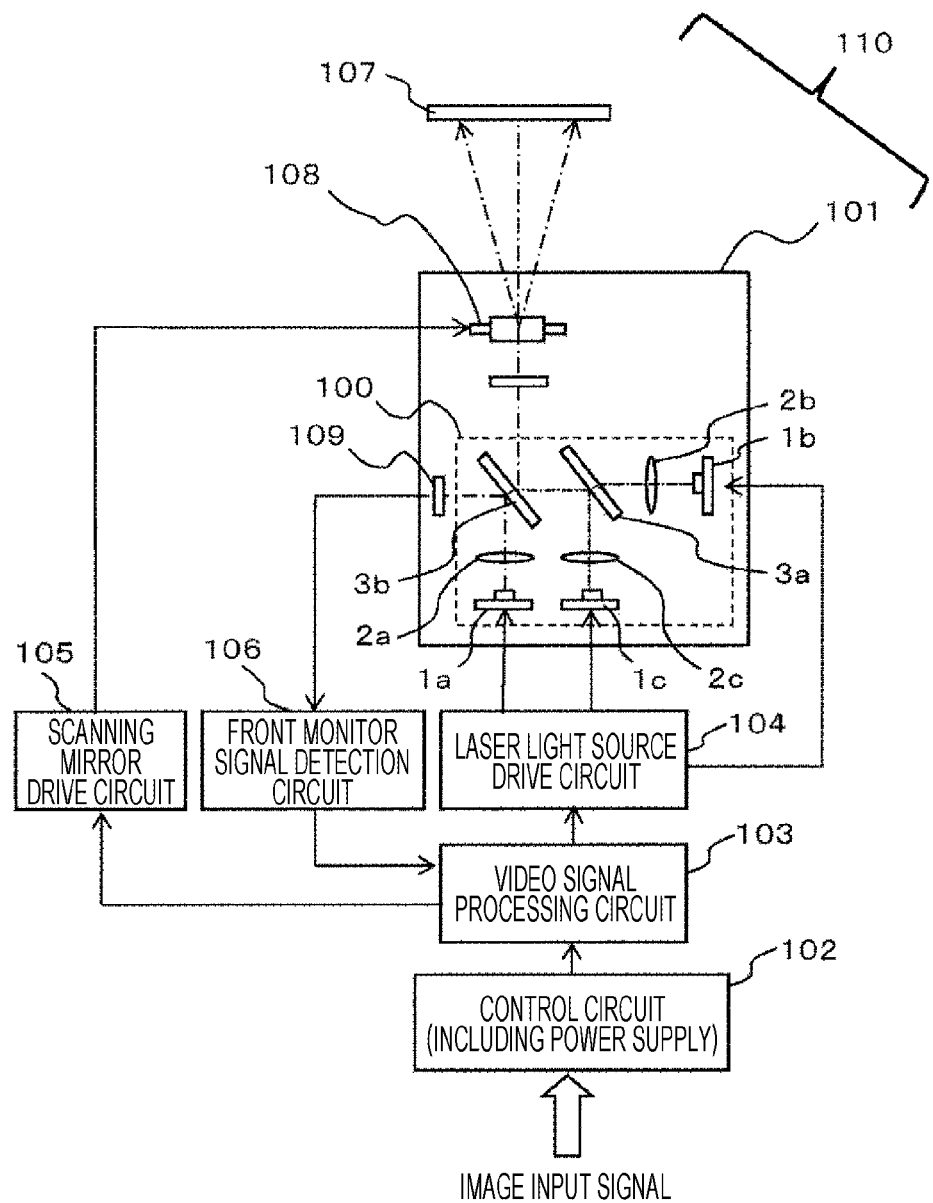
FIG. 1 is an overall configuration diagram showing a scanning-type image display device according to one embodiment of the present invention.

FIG. 1 is an overall configuration diagram showing a scanning-type image display device according to a first embodiment of the present invention.

As shown in FIG. 1, a scanning-type image display device 110 includes an optical module 101, a control circuit 102 having a built-in power supply, a video signal processing circuit 103, a laser beam source drive circuit 104, a front monitor signal detection circuit 106, and a scanning mirror drive circuit 105, and is configured to scan a laser beam corresponding to an image input signal and project the laser beam onto a screen 107.

The optical module 101 includes a laser beam source module 100, a scanning unit including a scanning mirror 108, and a front monitor 109. The laser beam source module 100 includes: a first laser 1a, a second laser 1b, and a third laser 1c which are laser beam sources respectively corresponding to three colors, red (R)/green (G)/blue (B); a first collimator lens 2a that converts a laser beam emitted from the first laser 1a into substantially parallel light; a second collimator lens 2b that converts a laser beam emitted from the second laser 1b into substantially parallel light; and a third collimator lens 2c that converts a laser beam emitted from the third laser 1c into substantially parallel light. The laser beam from the second collimator lens 2b and the laser beam from the third collimator lens 2c are coupled to a composite beam that travels along a single axis by a first beam coupling unit 3a. The coupled laser beam is further coupled with the laser beam from the first collimator lens 2a by a second beam coupling unit 3b. The scanning unit including the scanning mirror 108 projects the laser beams coupled by the second beam coupling unit 3b onto the screen 107 and two-dimensionally scans the laser beams on the screen 107.

Next, various circuits capable of controlling the optical module 101 and projecting the laser beam corresponding to a desired image signal onto the screen 107.

The control circuit 102 having the built-in power supply and the like receives an externally input image signal and outputs the image signal to the video signal processing circuit 103. The video signal processing circuit 103 performs various processes on the received image signal, separates the image signal into signals corresponding to three colors of R/G/B, and outputs the signals to the laser beam source drive circuit 104. In addition, the video signal processing circuit 103 extracts a horizontal synchronizing signal (Hsync) and a vertical synchronizing signal (Vsync) from the received image signal and outputs the signals to the scanning mirror drive circuit 105. The laser beam source drive circuit 104 supplies the corresponding laser beam source (1a, 1b, 1c) in the laser beam source module 100 with a drive current for light emission according to a luminance value of each of the R/G/B signals received from the video signal processing circuit 103. As a result, the laser beam sources 1a, 1b, and 1c emit laser beams each having an intensity corresponding to the luminance value of each of the R/G/B signals according to a display timing.

Further, the scanning mirror drive circuit 105 supplies the scanning mirror 108 in the optical module 101 with drive signals for repeatedly rotating the mirror surface of the scanning mirror in a two-dimensional manner in accordance with the horizontal synchronizing signal and the vertical synchronizing signal received from the video signal processing circuit 103. According to the drive signals, the scanning mirror 108 reflects the coupled laser beam supplied from the second beam coupling unit 3b while repeatedly and periodically rotating the mirror surface by a predetermined angle. Consequently, the laser beam is scanned in the horizontal and vertical directions on the screen 107 to display an image.

The front monitor signal detection circuit 106 receives the signal from the front monitor 109 for detecting the coupled laser beams from the second beam coupling unit 3b, and detects an output level of each of the R/G/B laser beams output from the laser beam sources 1a, 1b, and 1c, respectively. The detected output level is input to the video signal processing circuit 103, and the drive currents to be supplied to the laser beam sources 1a, 1b, and 1c, respectively, are adjusted so as to obtain a predetermined output via the laser beam source drive circuit 104.

Note that a biaxial driving mirror created by a MEMS (Micro Electro Mechanical Systems) technology, for example, can be used as the scanning mirror 108. As a driving method, piezoelectric drive, electrostatic drive, electromagnetic drive, and the like can be used. It is also possible to prepare and arrange two uniaxial scanning mirrors so that laser beam scanning can be performed in directions that are orthogonal to each other.

Figure 2:
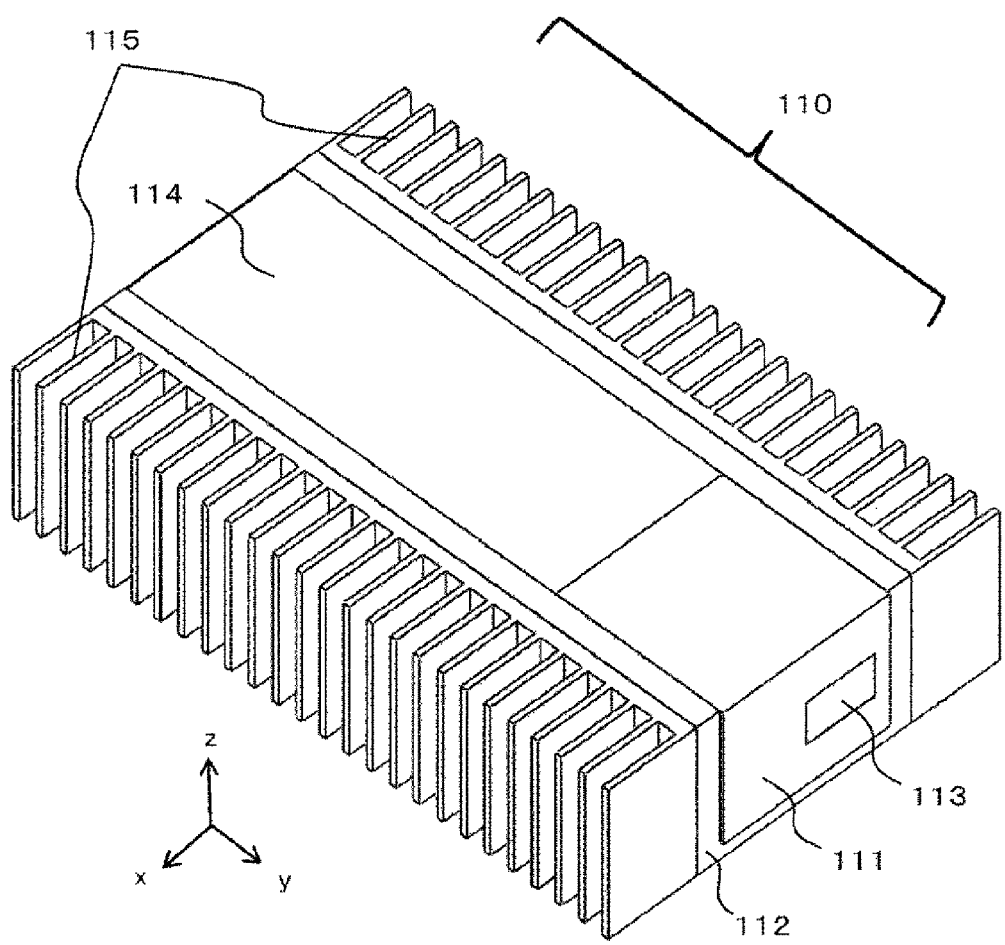
FIG. 2 is an appearance perspective view showing the scanning-type image display device according to one embodiment of the present invention.

FIG. 2 is an appearance perspective view showing the scanning-type image display device 110 according to one embodiment of the present invention. Referring to FIG. 2, the optical module 101 (not shown) is located in a cover 111 and a base 112. The cover 111 is provided with an injection port through which the coupled laser beams can be output, and the injection port is equipped with an injection port glass 113 to maintain the airtightness. At the back of the hermetically sealed cover 111, the control circuit 102 for controlling the optical module 101, the video signal processing circuit 103, the laser beam source drive circuit 104, the front monitor signal detection circuit 106, and the scanning mirror drive circuit 105 are mounted on the same substrate 121 (shown in FIG. 3) or a plurality of substrates (not shown). These substrates are arranged on the base 112 and protected by a protective cover 114. In this case, the cover 111 is formed of an Al (aluminum) member having a high thermal conductivity. The member for forming the cover is not limited to Al, but instead any member may be used as long as the member has a high thermal conductivity. For example, Cu may be used as the member for forming the cover. However, considering that the cover 111 is processed into a desired shape, Al with which mold injection can be performed. Further, the protective cover 114 is formed of a SPCC (cold rolled steel plate) such as a galvanized steel plate or a steel plate. Note that the protective cover 114 may be formed using an Al (aluminum) member or the like having a high thermal conductivity so that the protective cover 114 can have a heat radiation function.

A heatsink 115 is attached to the base 112, and radiates, to the outside, heat generated from the substrate 121 and the like on which the optical module 101 serving as a heating element (heat source) and various circuits as described above are mounted. The heatsink 115 is formed of a member, such as Al, which has a high thermal conductivity, and has a shape including a plurality of fins to increase the surface area of the heat sink. Note that, in this case, the base 112 may also have a heat radiation function by using an Al member having a high thermal conductivity, like the cover 111 and the heatsink 115.

When the temperature of each of the laser beam sources 1a, 1b, and 1c falls outside of the range of an operation guaranteed temperature due to a temperature rise at the time of using the scanning-type image display device 110, a difference in the visibility between colors is caused by a laser wavelength variation due to a temperature dependence, so that a color drift of an image, such as the entire screen turning red, is caused. This also causes deterioration in the laser output and a reduction in lifetime. Accordingly, in order to suppress a temperature rise during laser light emission, the base 112 and the heatsink 115 need to be attached to the optical module 101.

In the case of using the scanning-type image display device 110 as a head-up display mounted on a vehicle or the like, when the scanning-type image display device is left in a cold region and when the scanning-type image display device is left on a day when the temperature rises above 30° C., the environmental temperature varies in a range from minus several tens of ° C. to about +100° C. Accordingly, since the environmental temperature has a wider range of conditions than the range of the operation guaranteed temperature for the lasers, the optical module 101 and the scanning-type image display device 110 including the optical module 101 need to include a heating/cooling mechanism for adjusting the temperature within the operation guaranteed temperature for the lasers.

In this case, in order to adjust the temperature within the operation guaranteed temperature for the lasers, not only the heating/cooling function, but also a heat-insulating structure needs to be provided between the optical module 101 and the surrounding. If the efficiency of the heat-insulating structure is improved, an effect of reducing power consumption can also be expected.

Figure 3:
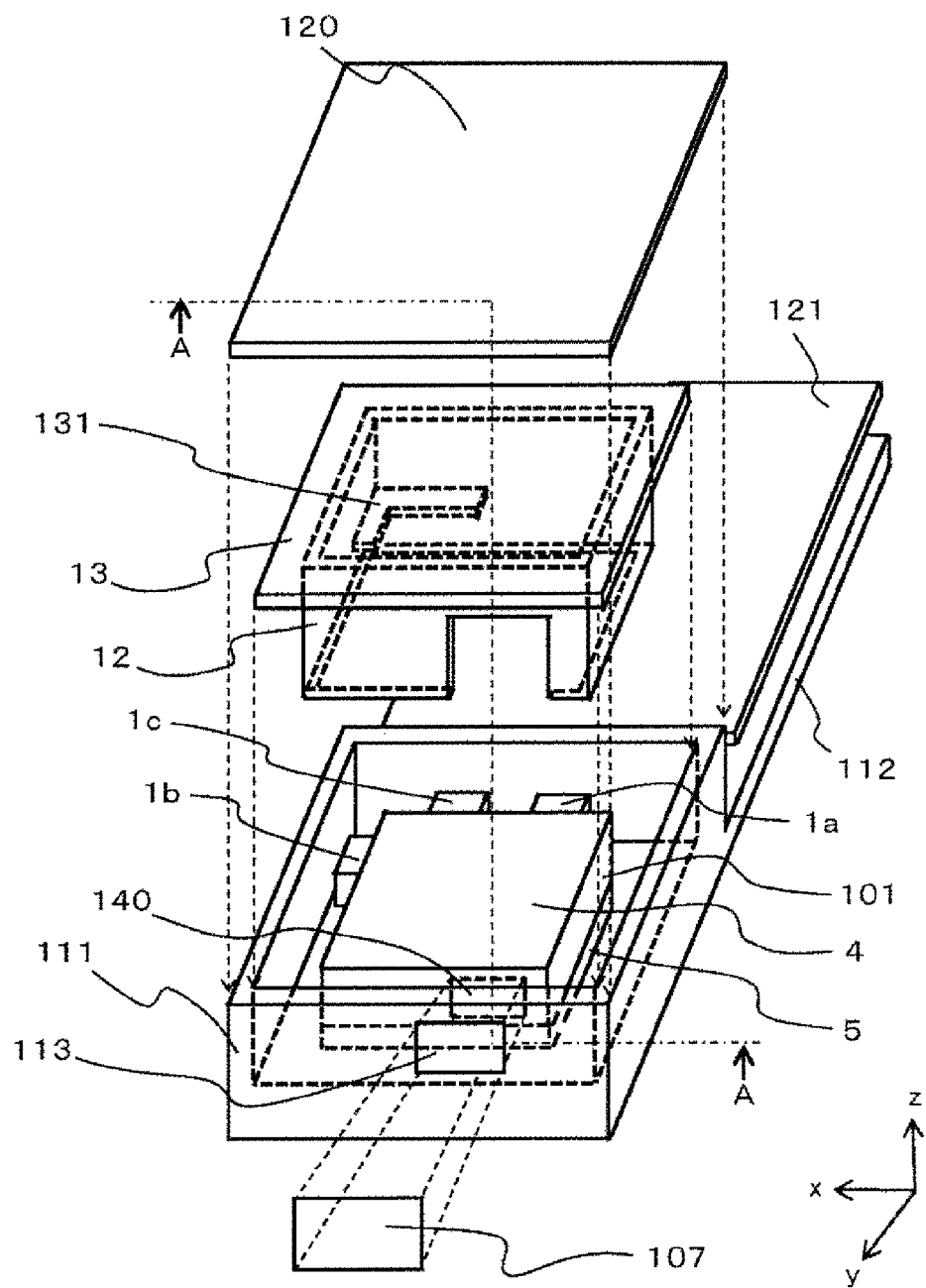
FIG. 3 is an exploded perspective view illustrating a second cover according to one embodiment of the present invention.

A specific structure of the heat-insulating structure will be described below. FIG. 3 is an exploded perspective view illustrating the second cover 12 according to an embodiment of the present invention. Referring to FIG. 3, the optical module 101 has a structure in which the first laser 1a, the second laser 1b, and the third laser 1c are attached to a module case 4 and the temperature of each of the first laser 1a, the second laser 1b, and the third laser 1c is maintained within the range of the operation guaranteed temperature by the temperature adjustment element 5 for controlling the temperature of the optical module 101. The temperature adjustment element 5 is connected to the base 112 so as to promote exhaust of heat. The second cover 12 that covers the optical module 101 is located in the cover 111 as a heat-insulating structure. The second cover 12 is provided with a top board 13 that is formed at an upper part thereof so as to stretch all over the internal width of the cover 111. A part of the second cover 12 is in contact with the cover 111, and has holes that are formed at a position where light passes and at a position of a wire provided for the lasers and the like.

Figure 4:
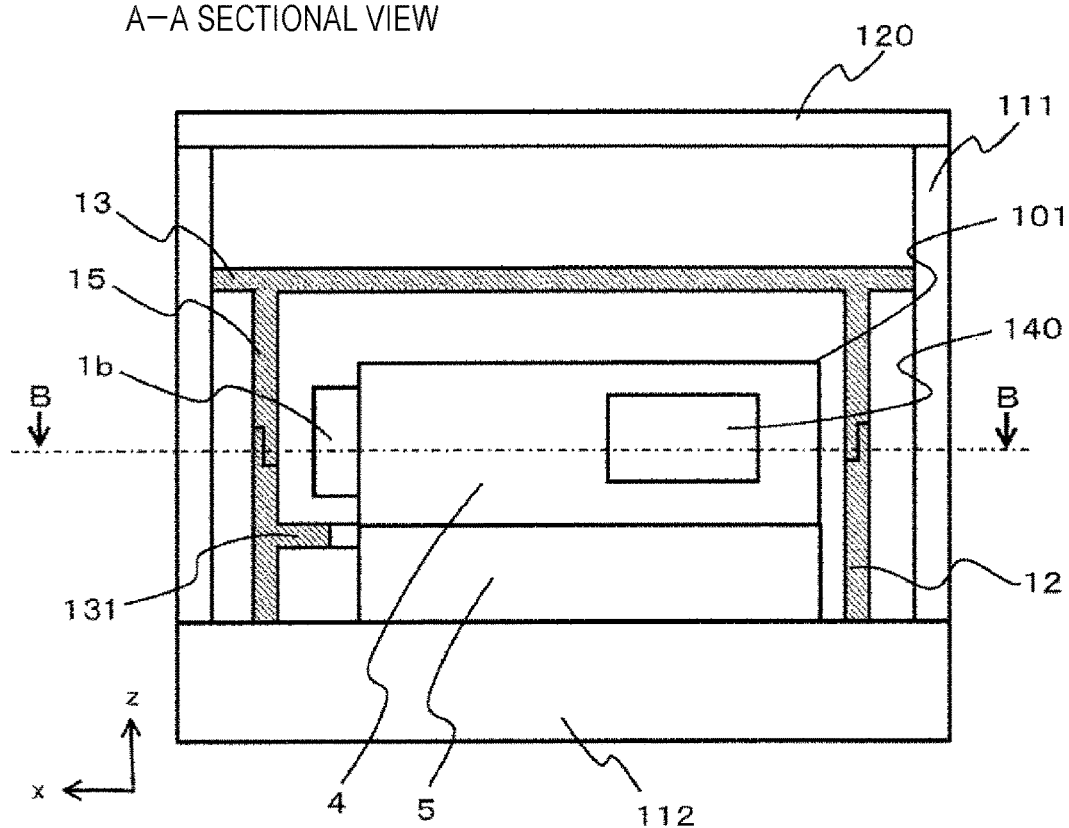
FIG. 4 is a sectional view illustrating the second cover according to one embodiment of the present invention.

The second cover according to the present invention will be described in detail with reference to FIG. 4. FIG. 4 is a sectional view taken along a line A-A in FIG. 3. The temperature adjustment element 5 is located on the base 112, and the module case 4 is located thereon. On the base 112, the cover 111 and the cover lid 120 are located so as to cover the module case 4. The module case 4 is provided with the first laser 1a (not shown), the second laser 1b, and the third laser 1c (not shown). The second cover is located in the cover 111 and the cover lid 120. The second cover includes the top board 13, the side surface 15, and a projecting part 131. The effect of preventing a temperature rise can be increased by providing the projecting part 131 at a location between the lasers, especially, at a location where a large convection occurs. The second cover is located in a space between the module case 4 and the temperature adjustment element 5 and a space between the cover 111 and the cover lid 120.

When the second cover 12 is disposed between the cover 111 and the optical module 101, the second cover 12 has an effect of preventing a heat inflow due to radiation of heat directly applied to the optical module 101 from the cover 111. Further, when the second cover is disposed between the cover 111 and the optical module 101, there is an effect that the space between the cover 111 and the optical module 101 is divided to thereby prevent a heat inflow between the cover 111 and the optical module 101 due to a convection. Furthermore, since the second cover is provided with the projecting part 131, the convection within the second cover can be reduced. In particular, temperature simulation results show that the temperature in the space between the first laser 1a and the third laser 1c and the temperature in the space between the second laser 1b and the third laser 1c are more likely to increase. Accordingly, a convection is likely to occur in these spaces, which causes a temperature rise in the cover 111.

Figure 5:
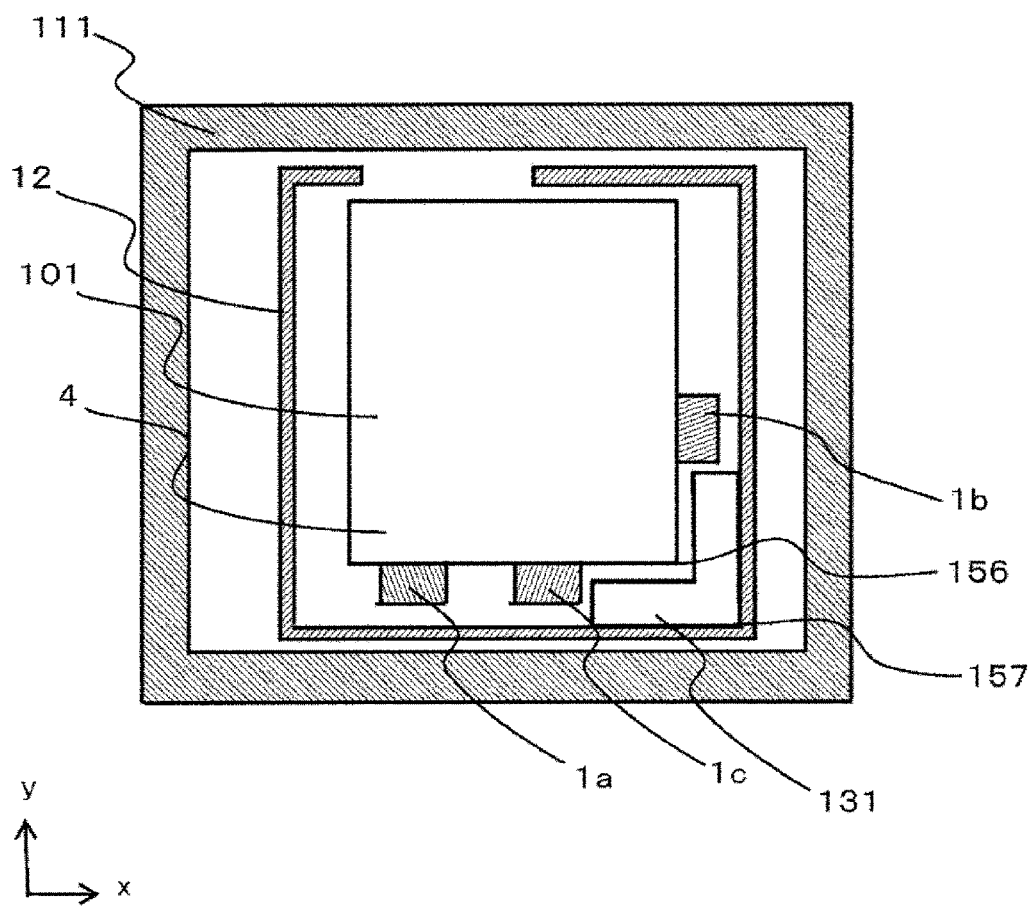
FIG. 5 is a sectional view illustrating the second cover according to one embodiment of the present invention.

FIG. 5 is a sectional view taken along a line B-B in FIG. 4, and illustrates that the first laser 1a and the third laser 1c are located side by side in the module case 4. The second laser 1b is located in the module case 4 with the angular part 156 of the module case interposed therebetween. FIG. 5 illustrates a structure in which the L-shaped projecting plate 131 is provided at a corner part 157 of the cover 12 between the laser 1b and the laser 1c where a convection is likely to occur. This structure enhances the effect of preventing a convection and reduces a temperature rise of the lasers. Further, thermal expansion or contraction of each component can be suppressed and deterioration of the projection image quality can be suppressed. The projecting part 131 is an example for preventing a convection. Further, since it is expected to obtain the heat insulating effect, the second cover 12 is preferably formed of resin.

Figure 6A:
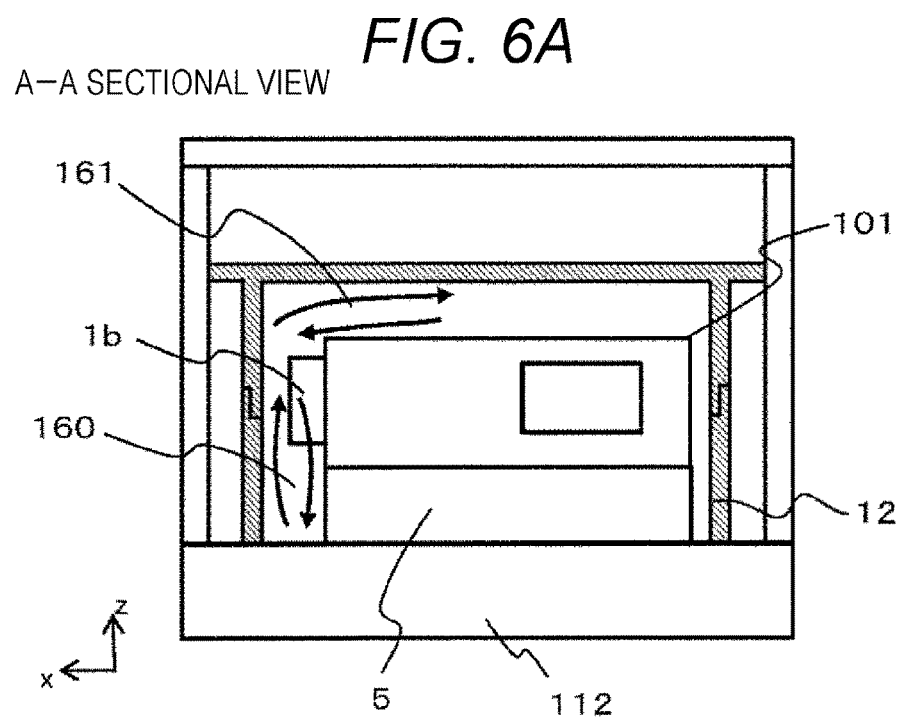
FIG. 6A is a sectional view illustrating a convection in the second cover according to one embodiment of the present invention (a projecting part is not provided).
Figure 6B:
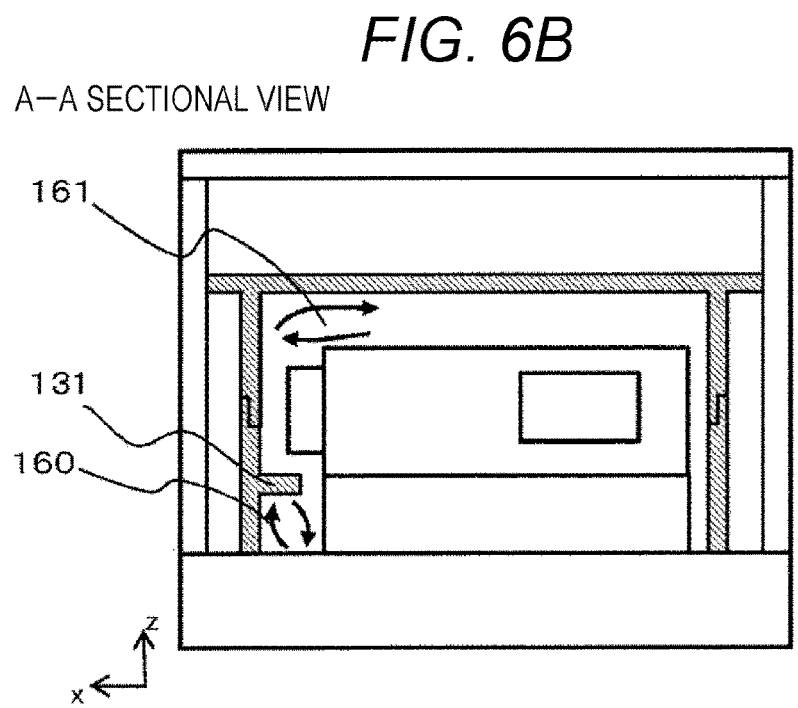
FIG. 6B is a sectional view illustrating convection in the second cover according to one embodiment of the present invention (a projecting part is provided).

Referring to FIGS. 6A and 6B, the operation of the projecting part 131 will be described. FIGS. 6A and 6B are sectional views taken along a line A-A in FIG. 3. FIG. 6A illustrates the structure of the second cover 12 in which the projecting part 131 is not located. FIG. 6B illustrates the structure of the second cover 12 in which the projecting part 131 is provided. In FIG. 6 and subsequent figures, the reference numerals denoting the same components are partially omitted. When the projecting part 131 is not provided, convections 160 and 161 occur in the cover 12 as shown in FIG. 6A and the temperature is diffused. When the projecting part 131 is formed in the cover 12 as shown in FIG. 6B, especially the convection 160 is blocked by the projecting part 131 and thus is decreased, which prevents temperature diffusion.

Second Embodiment

The second cover 12 according to a second embodiment of the present invention will be described.

Figure 7:
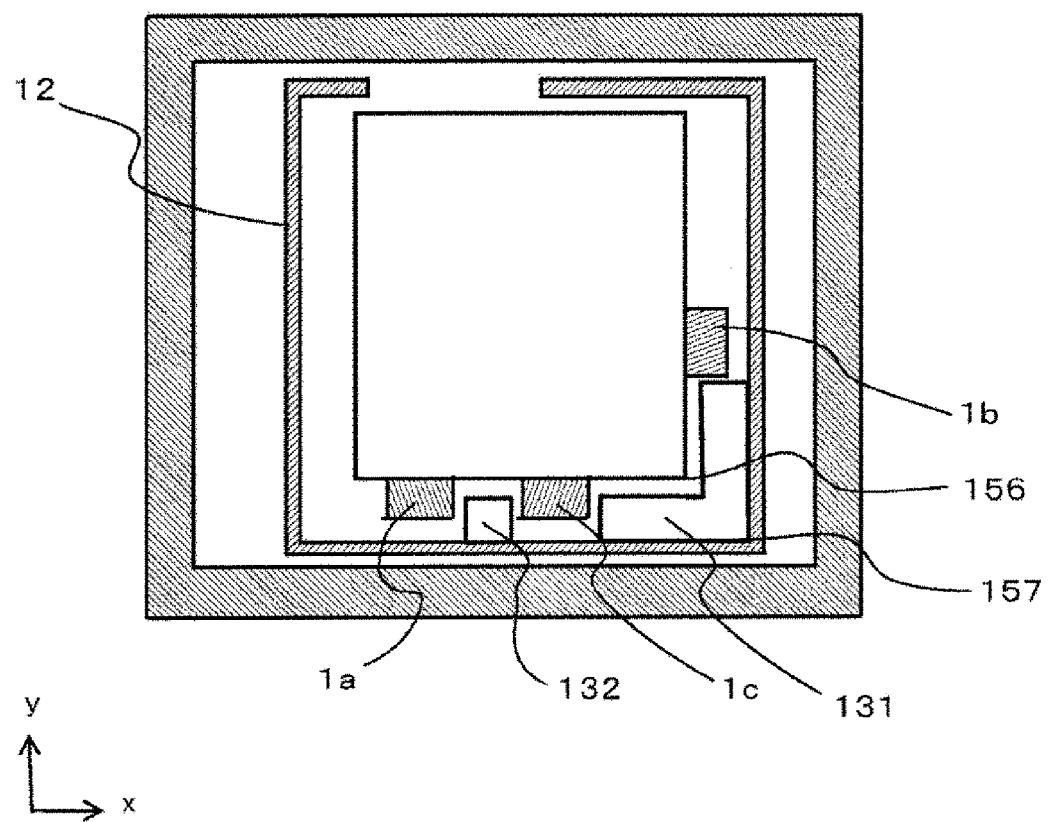
FIG. 7 is a sectional view illustrating a second cover according to a second embodiment of the present invention.

FIG. 7 is a sectional view taken along a line B-B in the second embodiment. The second embodiment differs from the first embodiment in that a projecting part 132 is provided in addition to the projecting part 131. As described in the first embodiment, the provision of the projecting part between the first laser and the third laser enables a further reduction in the convection within the space of the cover 12. This enhances the effect of reducing a temperature rise of the lasers.

Third Embodiment

The second cover 12 according to a third embodiment of the present invention will be described.

Figure 8:
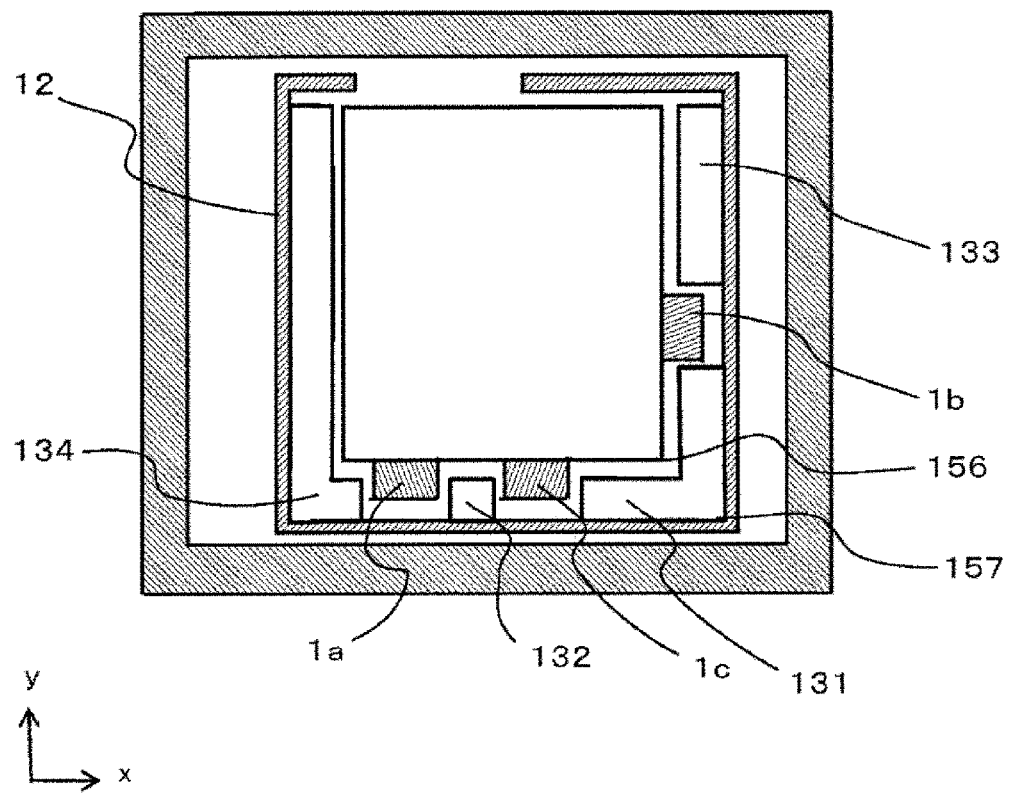
FIG. 8 is a sectional view illustrating a second cover according to a third embodiment of the present invention.
Figure 9:
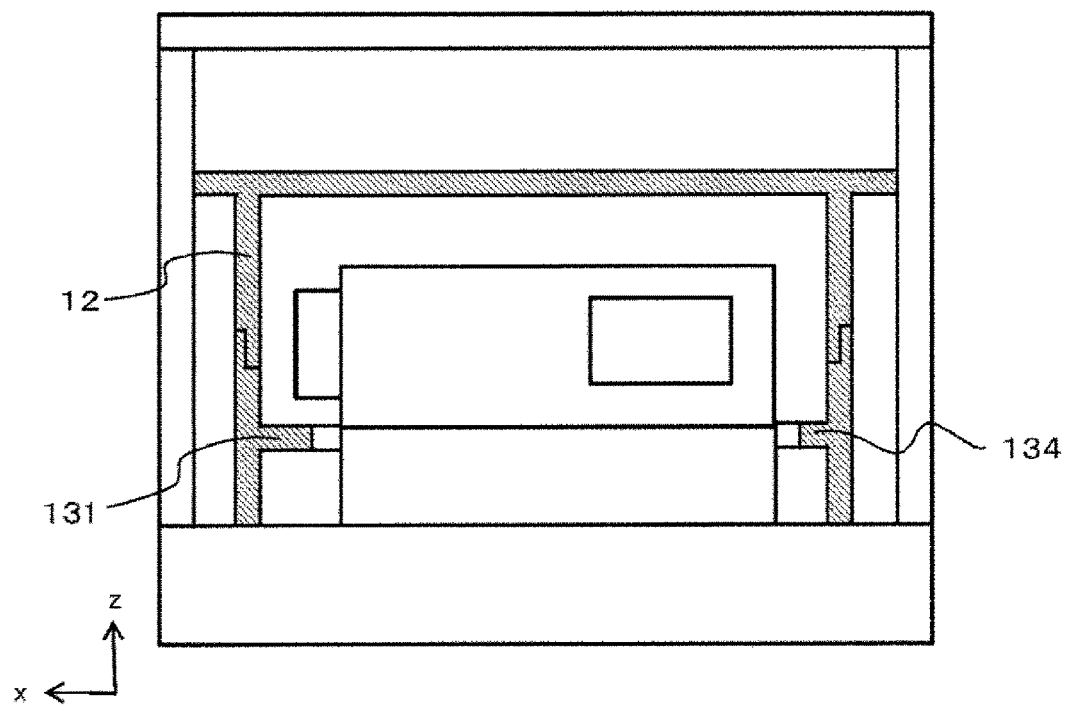
FIG. 9 is a sectional view illustrating the second cover according to the third embodiment of the present invention.

FIG. 8 is a sectional view taken along a line B-B in the third embodiment. The third embodiment differs from the second embodiment in that projecting parts 133 and 134 are provided in addition to the projecting parts 131 and 132. Consequently, a plurality of projecting parts are formed in the second cover 12, which further enhances the effect or preventing a convection. FIG. 9 is a sectional view taken along a line A-A in the third embodiment, and illustrates structures of the projecting parts 131 and 134 which are provided in the second cover.

Fourth Embodiment

The second cover 12 according to a fourth embodiment of the present invention will be described.

Figure 10:
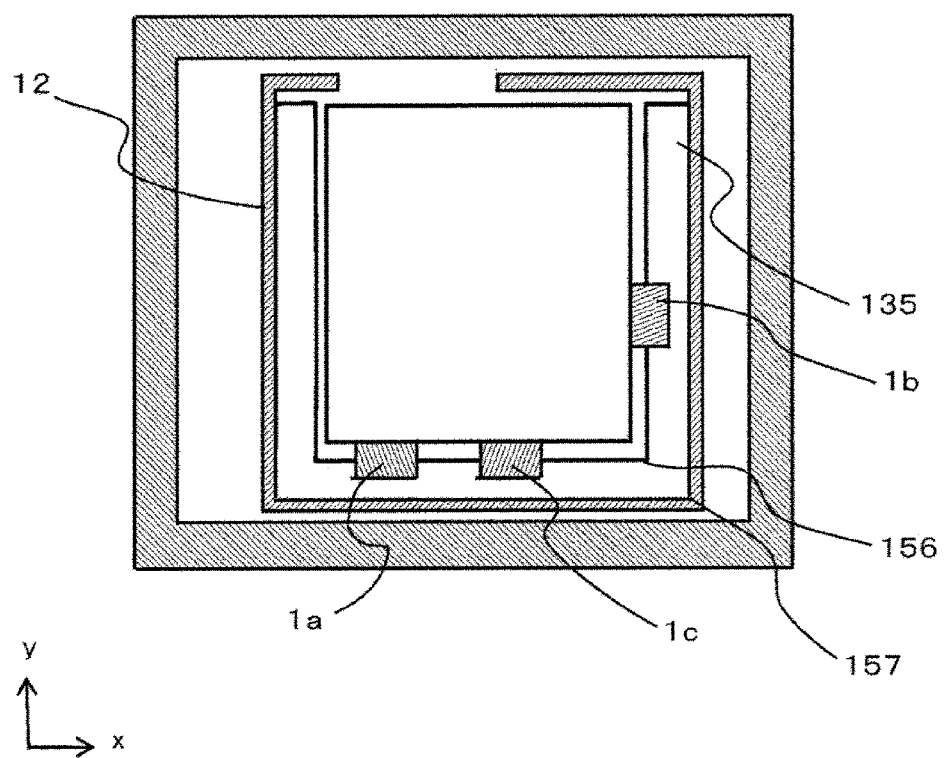
FIG. 10 is a sectional view illustrating a second cover according to a fourth embodiment of the present invention.

FIG. 10 is a sectional view taken along a line B-B in the fourth embodiment. The fourth embodiment differs from the third embodiment in that the fourth embodiment has an integrated structure in which the projecting part 135 is also formed at a lower part of each of the first laser 1a, the second laser 1b, and the third laser 1c. This further enhances the effect of preventing a convection.

Fifth Embodiment

The second cover 12 according to a fifth embodiment of the present invention will be described.

Figure 11:
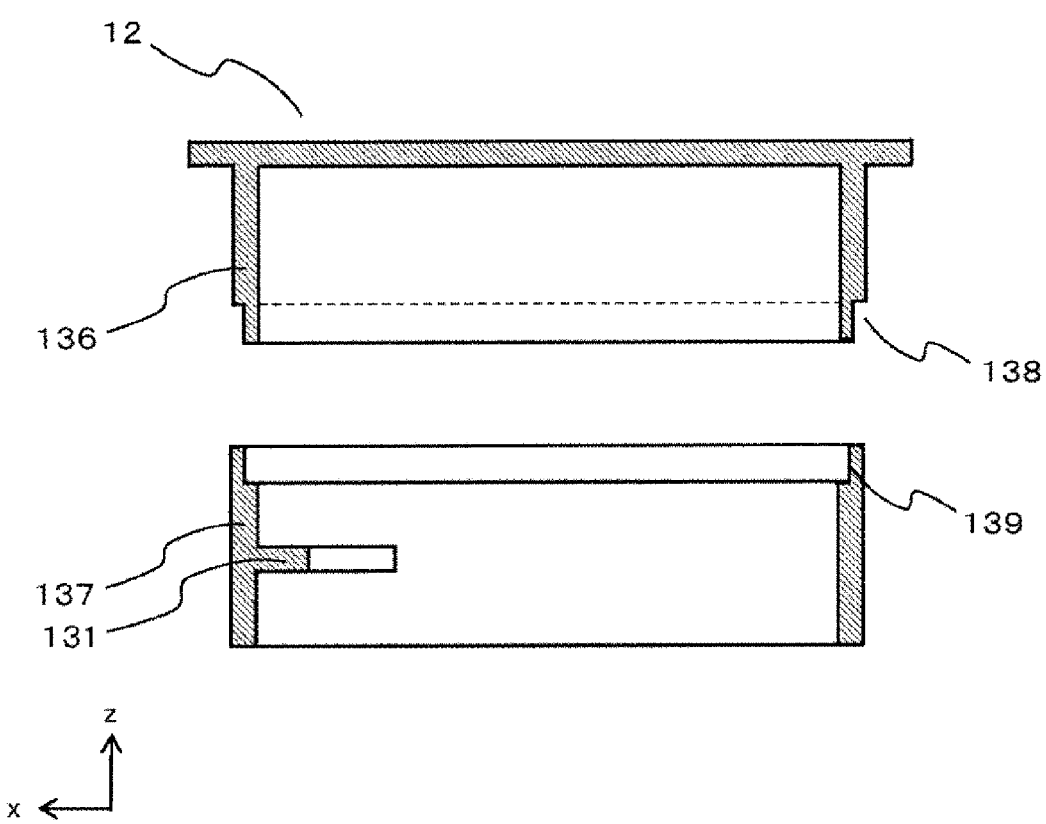
FIG. 11 is a sectional view showing a structure for manufacturing a second cover according to a fifth embodiment of the present invention.

FIG. 11 is a sectional view taken along a line A-A in the fifth embodiment, and illustrates a structure for manufacturing the second cover 12. In terms of mass production at low cost, the second cover 12 is preferably formed by resin mold injection. In this case, in order to form the projecting part 131, it is necessary to divide the second cover 12 into an upper cover 136 and a lower cover 137. The division of the second cover 12 makes it possible to easily remove the second cover 12 from the mold during mold injection. Further, the formation of a notch 138 of the upper cover 136 and a notch 139 of the lower cover 137 so that the upper cover 136 and the lower cover 137 are fit together facilitates an assembly work. An adhesive or the like may be omitted.

Sixth Embodiment

The second cover 12 according to a sixth embodiment of the present invention will be described.

Figure 12:
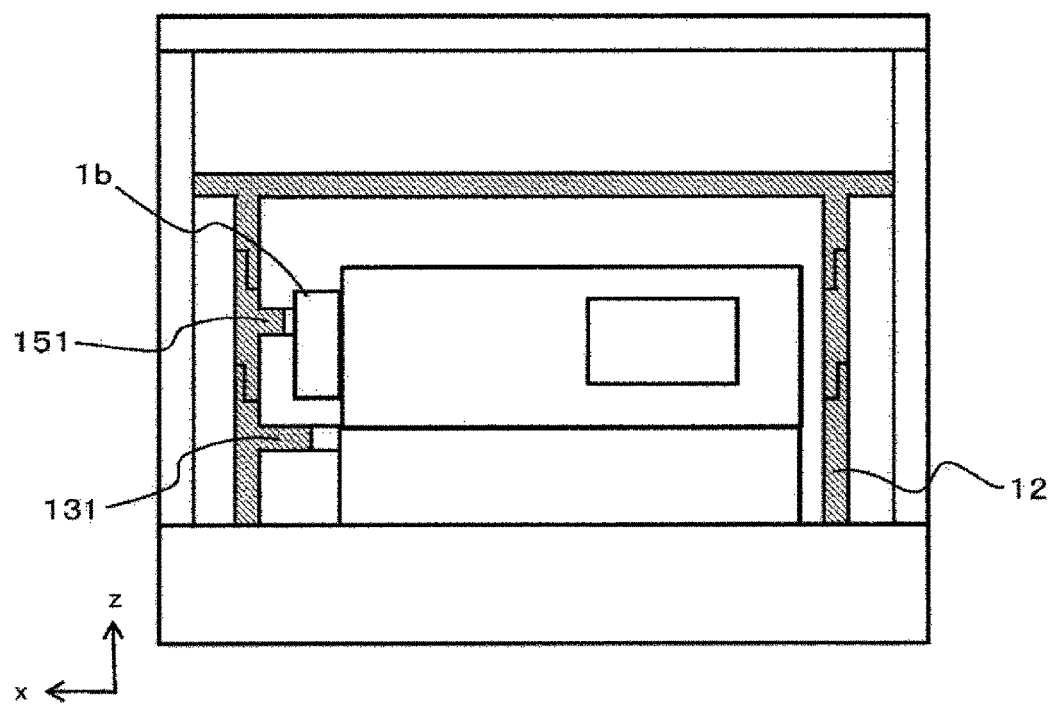
FIG. 12 is a sectional view illustrating a second cover according to a sixth embodiment of the present invention.

FIG. 12 is a sectional view taken along a line A-A in the sixth embodiment. This embodiment illustrates a structure in which a second projecting part 151 is provided on an upper side of the projecting part 131 described above with reference to FIGS. 4 and 5. This enhances the effect of preventing a convection and enables a reduction in temperature rise. Although not shown, in the third embodiment shown in FIG. 8, a structure in which a projecting part is additionally provided on the upper side of the projecting part 132 is also effective for preventing a convection.

Seventh Embodiment

The second cover 12 according to a seventh embodiment the present invention will be described.

Figure 13:
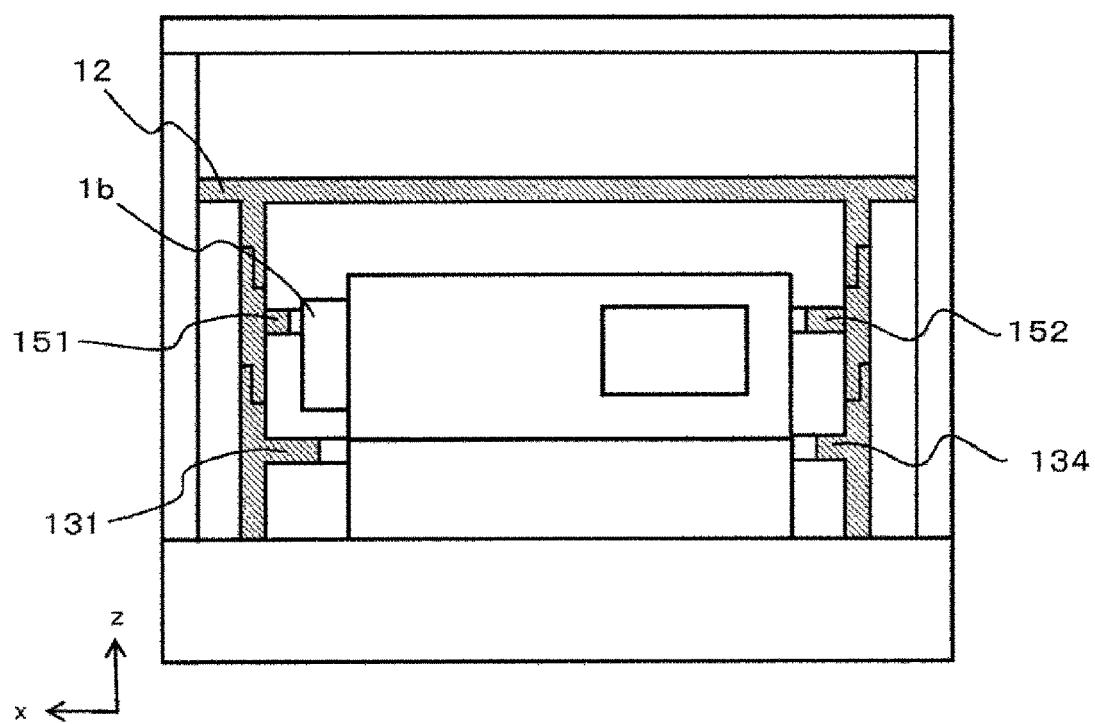
FIG. 13 is a sectional view illustrating a second cover according to a seventh embodiment of the present invention.

FIG. 13 is a sectional view taken along a line A-A in the seventh embodiment. Similarly to the sixth embodiment, this embodiment illustrates a structure in which a second projecting part 152 is also formed on the upper side of the projecting part 134 of the third embodiment described above with reference to FIG. 8. Similarly to the sixth embodiment described above, the effect of preventing a convection is enhanced and a temperature rise can be reduced.

Eighth Embodiment

Figure 14:
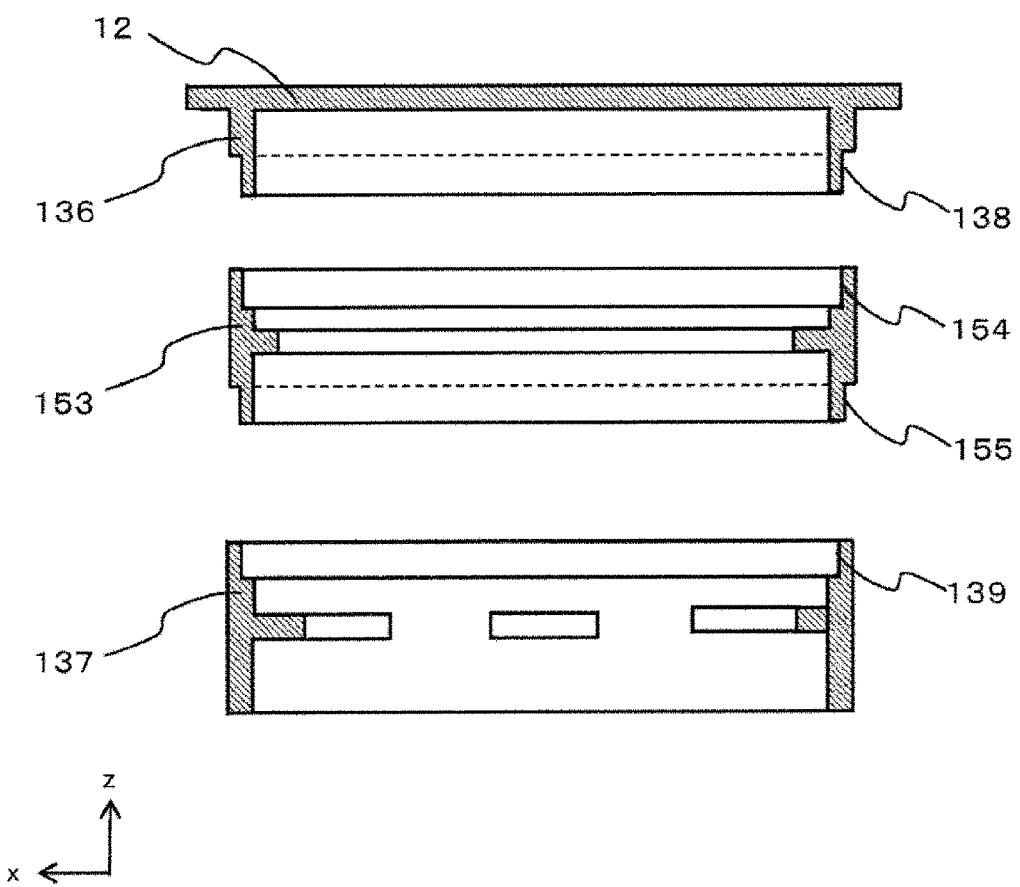
FIG. 14 is a sectional view showing a structure for manufacturing a second cover according to an eighth embodiment of the present invention.

FIG. 14 illustrates a structure for manufacturing the second cover 12 according to an eighth embodiment of the present invention.

FIG. 14 is a sectional view taken along a line A-A in the seventh embodiment. The seventh embodiment differs from the fifth embodiment in that an intermediate cover 153 is provided between the upper cover 136 and the lower cover 137 in the cover 12. This enables an operation for removing the cover from the mold when the cover is manufactured by injection molding. Further, the formation of a notch 154 and a notch 155 in the intermediate cover 153 allows the notch 138 of the upper cover 136 and the notch 139 of the lower cover 137 to be fit together, which leads to an improvement in assemblability. This facilitates alignment of the upper cover 136, the intermediate cover 153, and the lower cover 137 during the assembly work.

REFERENCE SIGNS LIST 1a first laser
1b second laser
1c third laser
2a first collimator lens
2b second collimator lens
2c third collimator lens
3a first beam coupling unit
3b second beam coupling unit
4 module case
5 temperature adjustment element
12 second cover
13 top board
15 side surface
100 laser beam source module
101 optical module
102 control circuit
103 video signal processing circuit
104 laser beam source drive circuit
105 scanning mirror drive circuit
106 front monitor signal detection circuit
107 screen
108 scanning mirror
109 front monitor
110 scanning-type image display device
111 cover
112 base
113 injection port glass
114 protective cover
115 heatsink
120 cover lid
121 substrate
131, 132, 133, 134, 135 projecting part
136 upper cover
137 lower cover
138, 139 notch
140 injection port
151 second projecting part
152 second projecting part
153 intermediate cover
154, 155 notch
156 angular part
157 corner part
160, 161 convection

The invention claimed is:

1. An optical module that couples laser beams from a plurality of laser beam sources and irradiates the laser beams to a desired position, the optical module comprising:
a cover that covers the optical module;
a second cover provided between the optical module and the cover; and
at least one projecting part provided in a space between a first laser beam source and a second laser beam source on a surface of the second cover facing the optical module.

2. An optical module that couples laser beams from a plurality of laser beam sources and irradiates the laser beams to a desired position, the optical module comprising:
a cover that covers the optical module;
a second cover provided between the optical module and the cover; and
a projecting part provided on a surface of a corner part of the second cover facing the optical module.

3. The optical module according to claim 1, wherein the projecting part is formed on the surface facing the optical module in an area other than an area in which light is emitted from the optical module.

4. The optical module according to claim 2, wherein the projecting part has an L-shape.

5. The optical module according to claim 1, wherein the projecting part is structured to have two upper and lower stages.

6. The optical module according to claim 1, wherein
the cover includes two components of an upper cover and a lower cover, and
a lower part of the upper cover and an upper part of the lower cover are each provided with a notch and the notches are fit together.

7. The optical module according to claim 5, wherein
the cover includes three components of an upper cover, an intermediate cover, and a lower cover, and
a lower part of the upper cover, an upper part and a lower part of the intermediate cover, and an upper part of the lower cover are each provided with a notch, and the notches are fit together.

8. A scanning-type image display device comprising:
an optical module that couples laser beams from a plurality of laser beam sources and causes a scanning mirror to irradiate the coupled laser beams to a desired position;
a video signal processing circuit that extracts a horizontal synchronizing signal and a vertical synchronizing signal from an image signal externally input;
a laser beam source drive circuit that supplies each of the laser beam sources with a drive current; and
a scanning mirror drive circuit that controls the scanning mirror based on the horizontal synchronizing signal and the vertical synchronizing signal,
wherein the cover according to claim 2 is mounted on the scanning-type image display device.

9. A scanning-type image display device comprising:
an optical module that couples laser beams from a plurality of laser beam sources and causes a scanning mirror to irradiate the coupled laser beams to a desired position;
a video signal processing circuit that extracts a horizontal synchronizing signal and a vertical synchronizing signal from an image signal externally input;
a laser beam source drive circuit that supplies each of the laser beam sources with a drive current; and a scanning mirror drive circuit that controls the scanning mirror based on the horizontal synchronizing signal and the vertical synchronizing signal, wherein a cover that covers the optical module is provided, a second cover is provided between the optical module and the cover, and at least one projecting part is provided on a surface of the second cover facing the optical module.

\* \* \* \* \*